（12） United States Patent
Sekine et al.

(10) Patent No.: US 10,491,191 B2
(45) Date of Patent: Nov. 26, 2019

(54) ACOUSTIC WAVE DEVICE AND METHOD OF FABRICATING THE SAME

(71) Applicant: TAIYO YUDEN CO., LTD., Tokyo (JP)

(72) Inventors: Hideyuki Sekine, Tokyo (JP); Osamu Kawachi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 35 days.

(21) Appl. No.: 15/649,483

(22) Filed: Jul. 13, 2017

(65) Prior Publication Data

US 2018/0048290 A1    Feb. 15, 2018

(30) Foreign Application Priority Data

Aug. 10, 2016   (JP) .................................. 2016-158253

(51) Int. Cl.
  *H03H 9/54*   (2006.01)
  *H03H 9/17*   (2006.01)
  (Continued)

(52) U.S. Cl.
  CPC ............... *H03H 9/54* (2013.01); *H03H 3/02* (2013.01); *H03H 9/171* (2013.01); *H03H 9/173* (2013.01);
  (Continued)

(58) Field of Classification Search
  CPC .................................................. H03H 9/54–62
  See application file for complete search history.

(56) References Cited

U.S. PATENT DOCUMENTS 6,924,583 B2 *  8/2005  Lin .......................... H03H 3/04
                                                                310/312
7,190,241 B2 *  3/2007  Ebata ................. H03H 9/02921
                                                                333/133

(Continued)

FOREIGN PATENT DOCUMENTS

JP        S63-187713 A    8/1988
JP        H07-221587 A    8/1995
                (Continued)

OTHER PUBLICATIONS

Japanese Office Action dated Feb. 5, 2019, in a counterpart Japanese patent application No. 2016-158253. (A machine translation (not reviewed for accuracy) attached.).

*Primary Examiner* — Dean O Takaoka
*Assistant Examiner* — Alan Wong
(74) *Attorney, Agent, or Firm* — Chen Yoshimura LLP

(57) ABSTRACT

A method of fabricating an acoustic wave device includes: forming a piezoelectric thin film resonator and a second lower electrode on a substrate, the piezoelectric thin film resonator having a resonance region in which a first lower electrode and a first upper electrode face each other across a piezoelectric film, the piezoelectric film and the first upper electrode are not formed on the second lower electrode outside the resonance region; forming a first dielectric film in the resonance region and a second dielectric film on the second lower electrode outside the resonance region at a same time, the first dielectric film and the second dielectric film being made of a material different from a material of the piezoelectric film; and forming a second upper electrode on the second dielectric film, the second upper electrode facing the second lower electrode.

8 Claims, 17 Drawing Sheets

(51) Int. Cl.
*H03H 3/02* (2006.01)
*H03H 9/56* (2006.01)

(52) U.S. Cl.
CPC ............ *H03H 9/542* (2013.01); *H03H 9/568* (2013.01); *H03H 2003/021* (2013.01); *H03H 2003/023* (2013.01)

(56) References Cited

U.S. PATENT DOCUMENTS

| 8,756,778 B2* | 6/2014 | Bar ........................ H01G 4/228 29/25.42 |
| 9,742,377 B2* | 8/2017 | Iwaki ..................... H03H 9/205 |
| 2014/0210570 A1 | 7/2014 | Nishihara et al. |
| 2015/0130560 A1 | 5/2015 | Yokoyama et al. |

FOREIGN PATENT DOCUMENTS

| JP | 2014-161001 A | 9/2014 |
| JP | 2015-095714 A | 5/2015 |

* cited by examiner

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2016-158253, filed on Aug. 10, 2016, the entire contents of which are incorporated herein by reference.

FIELD

A certain aspect of the present invention relates to an acoustic wave device and a method of fabricating the same.

BACKGROUND

Acoustic wave devices using piezoelectric thin film resonators have been used as filters and multiplexers of wireless devices such as, for example, mobile phones. The piezoelectric thin film resonator has a structure designed to have a lower electrode and an upper electrode facing each other across a piezoelectric film as disclosed in, for example, Japanese Patent Application Publication No. 2014-161001. The region where the lower electrode and the upper electrode face each other across the piezoelectric film is a resonance region.

A capacitor may be connected in series with or in parallel to the piezoelectric thin film resonator. Since the piezoelectric thin film resonator functions as a capacitor at frequencies away from the resonant frequency, it may be considered to use the piezoelectric thin film resonator as a capacitor. However, the piezoelectric film of the piezoelectric thin film resonator is thick, resulting in increase in area of the capacitor.

SUMMARY OF THE INVENTION

According to a first aspect of the present invention, there is provided a method of fabricating an acoustic wave device, the method including: forming a piezoelectric thin film resonator and a second lower electrode on a substrate, the piezoelectric thin film resonator having a resonance region in which a first lower electrode and a first upper electrode face each other across a piezoelectric film, the piezoelectric film and the first upper electrode are not formed on the second lower electrode outside the resonance region; forming a first dielectric film in the resonance region and a second dielectric film on the second lower electrode outside the resonance region at a same time, the first dielectric film and the second dielectric film being made of a material different from a material of the piezoelectric film; and forming a second upper electrode on the second dielectric film, the second upper electrode facing the second lower electrode.

According to a second aspect of the present invention, there is provided an acoustic wave device including: a piezoelectric thin film resonator including: a piezoelectric film located on a substrate; a first lower electrode and a first upper electrode sandwiching the piezoelectric film; and a first dielectric film located in a resonance region in which the first lower electrode and the first upper electrode face each other across the piezoelectric film; and a capacitor including: a second dielectric film that is located on the substrate, is made of a same material as the first dielectric film, and has a film thickness approximately equal to a film thickness of the first dielectric film; and a second lower electrode and a second upper electrode that does not sandwich the piezoelectric film and sandwich the second dielectric film.

DETAILED DESCRIPTION

Figure 1:
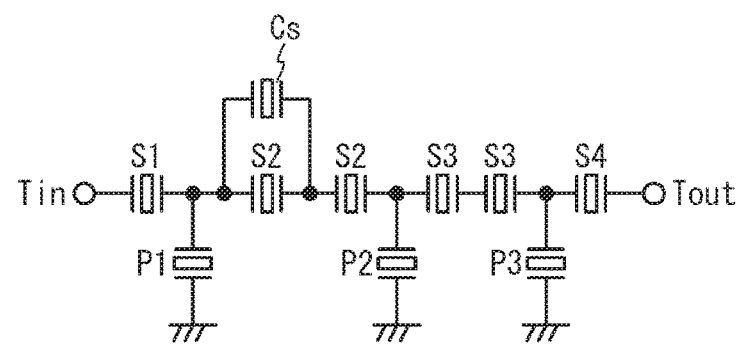
FIG. 1 is a circuit diagram of a filter in accordance with a first comparative example.

A description will first be given of a comparative example. FIG. 1 is a circuit diagram of a filter in accordance with a first comparative example. As illustrated in FIG. 1, series resonators S1 through S4 are connected in series between an input terminal Tin and an output terminal Tout. Each of the series resonators S2 and S3 is serially divided. Parallel resonators P1 through P3 are connected in parallel between the input terminal Tin and the output terminal Tout. The series resonators S1 through S4 and the parallel resonators P1 through P3 are piezoelectric thin film resonators. A capacitor Cs is connected in parallel to one of the divided series resonators S2. The capacitor Cs is a capacitor formed of a piezoelectric thin film resonator. The electromechanical coupling coefficient $k^2$ of the series resonator S2 can be reduced by connecting the capacitor Cs in parallel to the series resonator S2. Accordingly, the skirt characteristic of the ladder-type filter is steepened. For example, when the electromechanical coupling coefficient of the series resonator is reduced, the skirt characteristic at the high frequency side of the passband is steepened. Thus, the steepness of the transmission characteristics in the transition area between the passband and a band higher than passband in frequency is improved, and the transition width can be narrowed.

Figure 2:
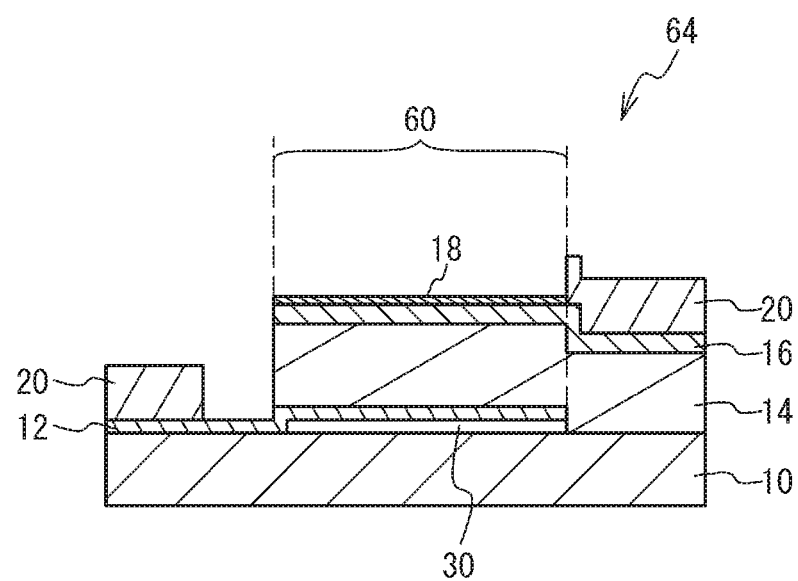
FIG. 2 is a cross-sectional view of a capacitor in the first comparative example.

Next, the capacitor Cs will be described. FIG. 2 is a cross-sectional view of the capacitor in the first comparative example. As illustrated in FIG. 2, in a capacitor 64, a lower electrode 12, a piezoelectric film 14, an upper electrode 16, and a dielectric film 18 are stacked on a substrate 10. An air gap 30 is formed between the lower electrode 12 and the substrate 10. The region where the lower electrode 12 and the upper electrode 16 face each other across the piezoelectric film 14 is a capacitor region 60. Outside the capacitor region 60, a wiring line 20 electrically connected to the lower electrode 12 is located on the lower electrode 12, and the wiring line 20 electrically connected to the upper electrode 16 is located on the upper electrode 16.

In the first comparative example, since the capacitor 64 is formed with use of the piezoelectric film 14, the capacitor 64 can be formed on the single substrate 10 on which the piezoelectric thin film resonator is also located. However, the film thickness of the piezoelectric film 14 is determined so that the piezoelectric thin film resonator exhibits desired performance. When the piezoelectric film 14 is made of aluminum nitride, the film thickness of the piezoelectric film 14 is, for example, 1000 nm. Aluminum nitride has a relative permittivity of approximately 8.5. As described above, the first comparative example uses the thick piezoelectric film 14, resulting in increase in area of the capacitor region 60.

First Embodiment

Figure 3:
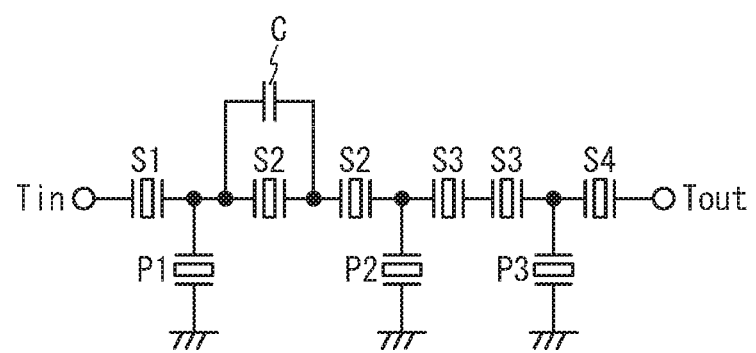
FIG. 3 is a circuit diagram of a filter in accordance with a first embodiment.

FIG. 3 is a circuit diagram of a filter in accordance with a first embodiment. As illustrated in FIG. 3, a Metal Insulator Metal (MIM) capacitor C is used instead of the capacitor Cs using a piezoelectric thin film resonator. Other structures are the same as those of the first comparative example, and the description thereof is thus omitted.

Figure 4:
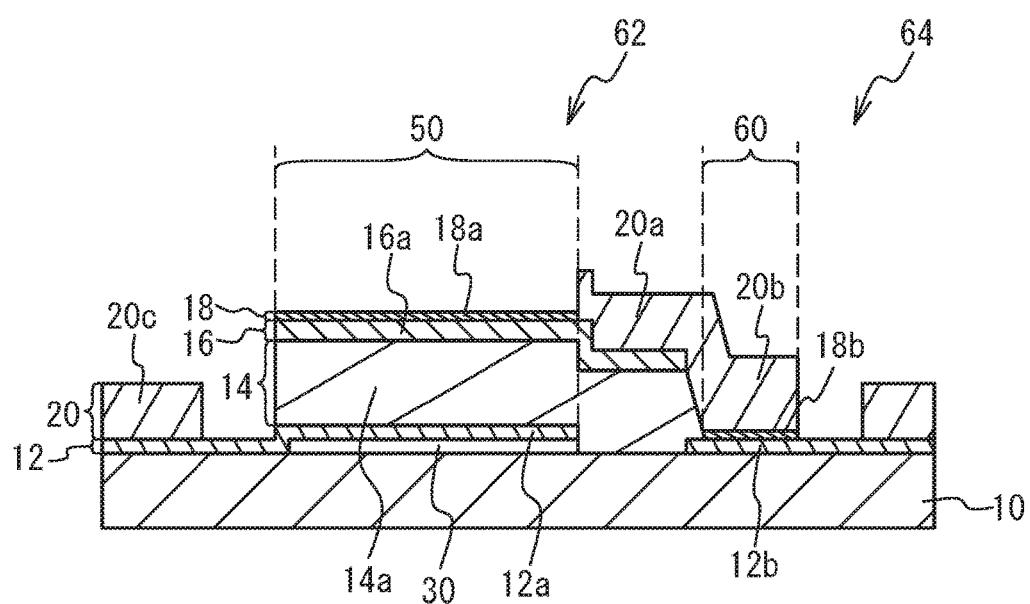
FIG. 4 is a cross-sectional view of an acoustic wave device in accordance with the first embodiment.

FIG. 4 is a cross-sectional view of an acoustic wave device in accordance with the first embodiment. As illustrated in FIG. 4, a piezoelectric thin film resonator 62 and the capacitor 64 are located on the substrate 10. The piezoelectric thin film resonator 62 and the capacitor 64 have a resonance region 50 and the capacitor region 60, respectively. The resonance region 50 is a region where a lower electrode 12a and an upper electrode 16a face each other across a piezoelectric film 14a in the piezoelectric thin film resonator 62. The acoustic wave in the longitudinal oscillation mode resonates in the resonance region 50. The capacitor region 60 is a region where a lower electrode 12b and an upper electrode 20b face each other across a dielectric film 18b in the capacitor 64. The capacitance is proportional to the area of the capacitor region 60.

The lower electrodes 12a and 12b are located on the substrate 10. The lower electrode 12a in the resonance region 50 is located above the substrate 10 across the air gap 30. The piezoelectric film 14a is located on the lower electrode 12a in the resonance region 50. The upper electrode 16a is located on the piezoelectric film 14a in the resonance region 50. A dielectric film 18a is located on the upper electrode 16a in the resonance region 50. The dielectric film 18a functions as a frequency adjusting film that adjusts the resonant frequency by adjusting the film thickness thereof. The dielectric film 18a functions as a protective film in the resonance region 50. The dielectric film 18b is located on the lower electrode 12b in the capacitor region 60. Outside the resonance region 50, a wiring line 20a is located on the lower electrode 12 while a wiring line 20c is located on the upper electrode 16. The wiring line 20 as the upper electrode 20b is located on the dielectric film 18b in the capacitor region 60.

The substrate 10 is a silicon substrate. The substrate 10 may be, for example, a sapphire substrate, an alumina substrate, or a spinel substrate. The piezoelectric film 14 is made of aluminum nitride oriented in the (002) direction. The piezoelectric film 14 may be made of zinc oxide (ZnO), lead zirconate titanate (PZT), or lead titanate (PbTiO$_3$). The piezoelectric film 14 may be mainly composed of aluminum nitride, and may contain elements for improving resonance characteristics or piezoelectricity. The lower electrode 12 is formed of, for example, a chrome (Cr) film and a ruthenium (Ru) film located on the Cr film. The upper electrode 16 is formed of a Ru film and a Cr film located on the Ru film. The lower electrode 12 and the upper electrode 16 may be formed of a single-layer film of aluminum (Al), titanium (Ti), copper (Cu), molybdenum (Mo), tungsten (W), tantalum (Ta), platinum (Pt), rhodium (Rh), or iridium (Ir), or a multilayered film of at least two of them. The dielectric film 18 is a silicon oxide film (e.g., a SiO$_2$ film). The dielectric film 18 may be a silicon nitride film or a silicon oxynitride film. The wiring line 20 is formed of, for example, a Ti film and a gold (Au) film located on the Ti film.

Figure 5:
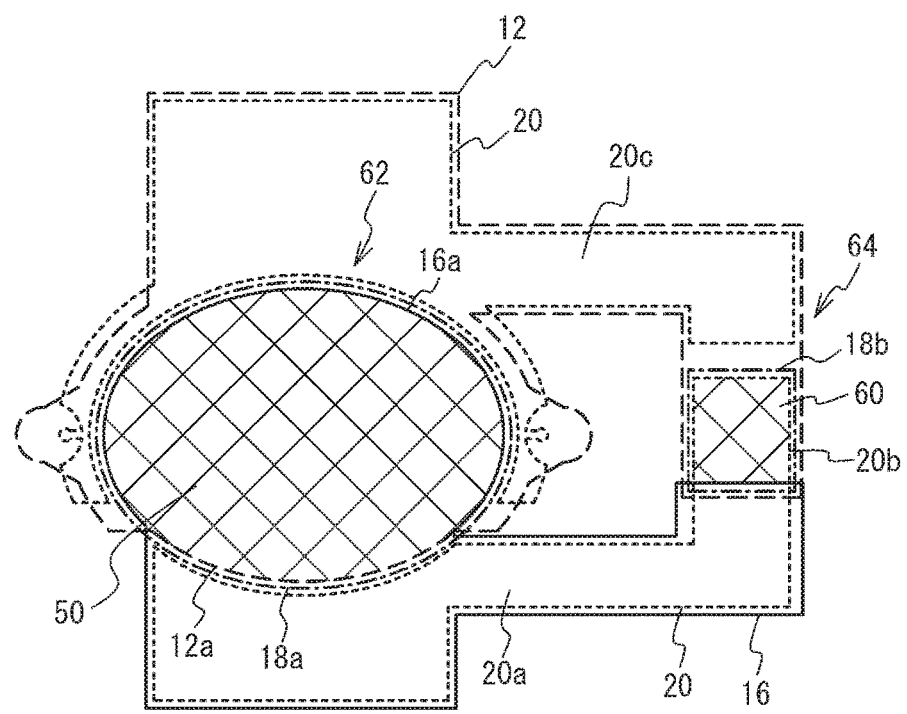
FIG. 5 is a plan view of the acoustic wave device in accordance with the first embodiment.
Figure 6A:
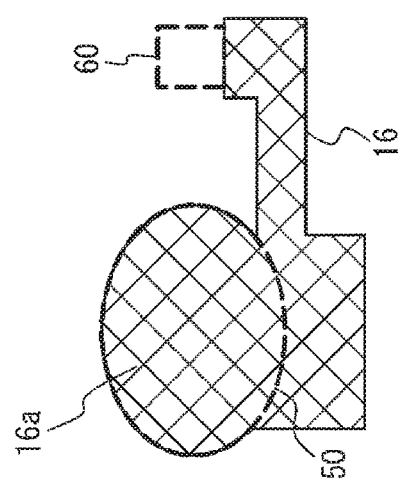
FIG. 6A through FIG. 6D are plan views of a lower electrode 12, an upper electrode 16, a wiring line 20, and a dielectric film 18, respectively.
Figure 6B:
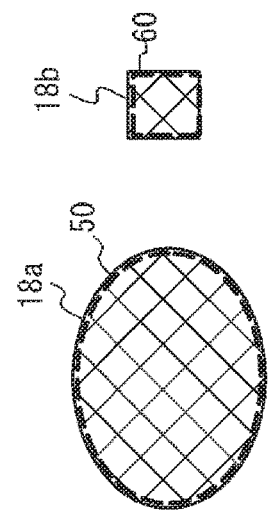

FIG. 5 is a plan view of the acoustic wave device in accordance with the first embodiment. FIG. 6A through FIG. 6D are plan views of the lower electrode 12, the upper electrode 16, the wiring line 20, and the dielectric film 18, respectively. In FIG. 5, the plane pattern of the piezoelectric film 14 is substantially the same as the plane pattern of the upper electrode 16. As illustrated in FIG. 5 through FIG. 6D, the resonance region 50 is defined by the outline of the lower electrode 12 in the extraction region of the upper electrode 16, and is defined by the outline of the upper electrode 16 in the extraction region of the lower electrode 12. The capacitor region 60 is defined by the outline of the dielectric film 18b in the extraction region of the upper electrode 20b, and is defined by the outline of the upper electrode 20b in the remaining region. The wiring line 20 as the upper electrode 20b is located on the dielectric film 18b in the capacitor region 60. The upper electrode 20b and the wiring line 20a are continuously located, and the upper electrode 20b is separated from the wiring line 20c. The lower electrodes 12a and 12b are continuously located. In the outside of the resonance region 50 in the major axis direction, hole portions for introducing an etching liquid that removes a sacrifice layer are formed in the lower electrode 12, but the detailed description thereof is omitted.

Figure 7A:
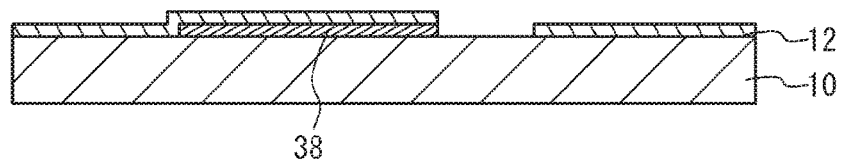
FIG. 7A through FIG. 7C are cross-sectional views (No. 1) illustrating a method of fabricating the acoustic wave device in the first embodiment.

FIG. 7A through FIG. 8C are cross-sectional views illustrating a method of fabricating the acoustic wave device in the first embodiment. As illustrated in FIG. 7A, a sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge), or silicon oxide (SiO$_2$), which easily dissolve in an etching liquid or an etching gas. Thereafter, the sacrifice layer 38 is patterned into a desired shape by photolithography and etching. The sacrifice layer 38 has a shape corresponding to the planar shape of the air gap 30, and includes, for example, a region to be the resonance region 50. Then, the lower electrode 12 is formed on the sacrifice layer 38 and the substrate 10. The sacrifice layer 38 and the lower electrode 12 are formed by, for example, sputtering, vacuum evaporation, or Chemical Vapor Deposition (CVD). Thereafter, the lower electrode 12 is patterned into a desired shape by photolithography and etching. The lower electrode 12 may be formed by liftoff.

Figure 7B:
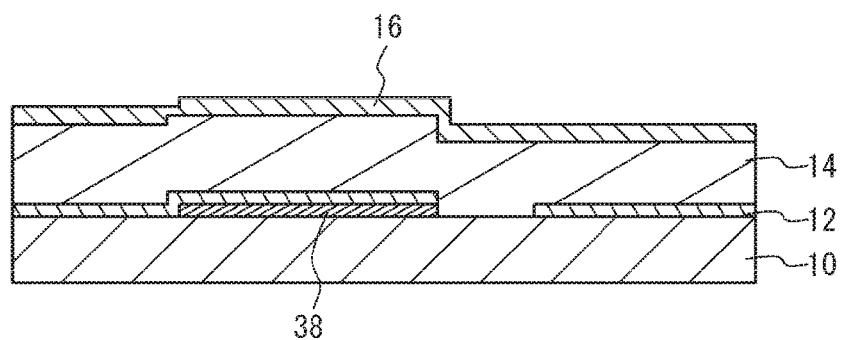

As illustrated in FIG. 7B, the piezoelectric film 14 is formed on the lower electrode 12 and the substrate 10 by, for example, sputtering, vacuum evaporation, or CVD. The upper electrode 16 is formed on the piezoelectric film 14 by sputtering, vacuum evaporation, or CVD.

Figure 7C:
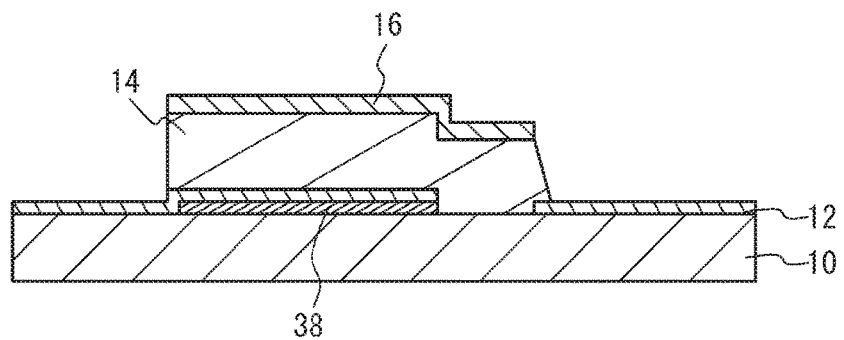

As illustrated in FIG. 7C, the upper electrode 16 is patterned into a desired shape by photolithography and etching. The upper electrode 16 may be formed by liftoff. The piezoelectric film 14 is patterned into a desired shape. In this process, the piezoelectric film 14 may be etched using the upper electrode 16 as a mask. This process patterns the piezoelectric film 14 into the same shape as the upper electrode 16.

Figure 8A:
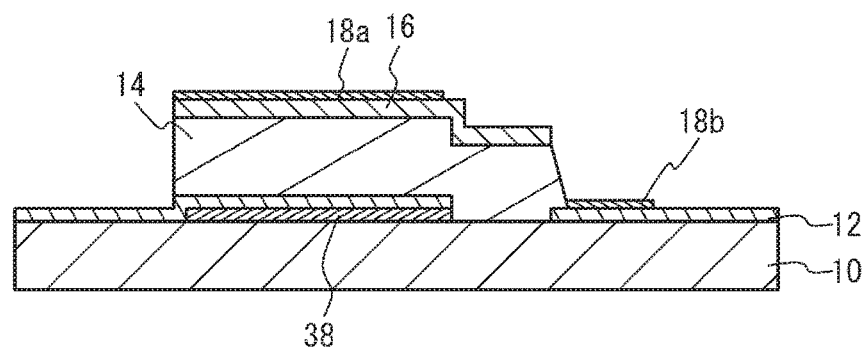
FIG. 8A through FIG. 8C are cross-sectional views (No. 2) illustrating the method of fabricating the acoustic wave device in the first embodiment.

As illustrated in FIG. 8A, the dielectric film 18 is formed on the lower electrode 12 and the upper electrode 16 by, for example, sputtering or CVD. The dielectric film 18 is patterned into a desired shape by photolithography and etching. This process forms the dielectric film 18a on the upper electrode 16 in the resonance region, and forms the dielectric film 18b on the lower electrode 12b in the capacitor region.

Figure 8B:
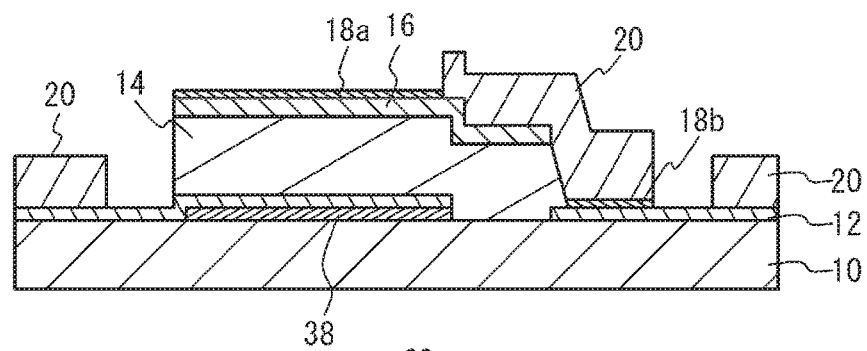

As illustrated in FIG. 8B, the wiring line 20 is formed. The wiring line 20 is formed by, for example, plating, sputtering, or evaporation. The wiring line is patterned into a desired shape by photolithography and/or etching.

Figure 8C:
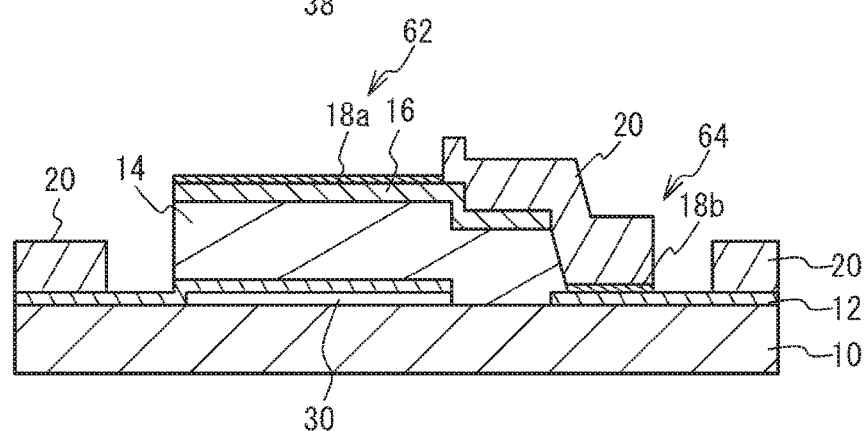

As illustrated in FIG. 8C, an etching liquid for etching the sacrifice layer 38 is introduced into the sacrifice layer 38 under the lower electrode 12. This process removes the sacrifice layer 38. A substance for etching the sacrifice layer 38 is preferably a substance that does not etch materials constituting the resonator except the sacrifice layer 38. Especially, a substance used for etching is preferably a substance that does not etch the lower electrode 12 with which the substance comes in contact. The stress of the multilayered film from the lower electrode 12 to the dielectric film 18 is set to a compression stress. This setting makes the multilayered film bulge out to the side opposite from the substrate 10 so as to separate from the substrate 10 when the sacrifice layer 38 is removed. The air gap 30 having a dome-shaped bulge is formed between the lower electrode 12 and the substrate 10. The piezoelectric thin film resonator 62 and the capacitor 64 in accordance with the first embodiment are fabricated through the above processes.

Measured was the transmission characteristic of the filter of the first embodiment illustrated in FIG. 3. Each resonator is a piezoelectric thin film resonator. The lower electrode 12 was formed of a Cr film with a film thickness of 70 nm and a Ru film with a film thickness of 178 nm, the piezoelectric film 14 was an aluminum nitride film with a film thickness of 999 nm oriented in the (002) direction, the upper electrode 16 was formed of an Ru film with a film thickness of 154 nm and a Cr film with a film thickness of 55 nm, and the dielectric film 18 was a silicon oxide film with a film thickness of 70 nm. The capacitor C had a capacitance of 0.7 pF. The transmission characteristic of a filter of a second comparative example without the capacitor C was also measured.

Figure 9:
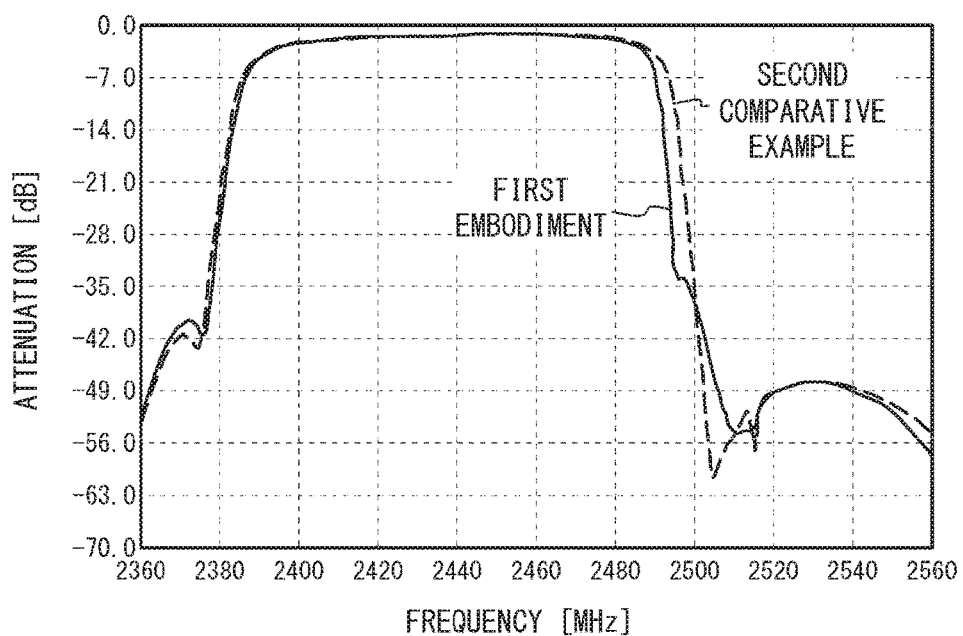
FIG. 9 illustrates transmission characteristics of filters in accordance with the first embodiment and a second comparative example.

FIG. 9 illustrates the transmission characteristics of the filters in accordance with the first embodiment and the second comparative example. As illustrated in FIG. 9, the skirt characteristic at the high frequency side of the passband in the first embodiment is steeper than that in the second comparative example. The transition width from −2 dB to −30 dB of attenuation is 15.6 MHz in the second comparative example and is 12.9 MHz in the first embodiment. As described above, the transition width at the high frequency side is reduced by connecting the capacitor C in parallel to the series resonator S2.

In the first embodiment, as illustrated in FIG. 7A through FIG. 7C, the piezoelectric thin film resonator 62, which has the resonance region 50 in which the lower electrode 12a (a first lower electrode) and the upper electrode 16a (a first upper electrode) face each other across the piezoelectric film 14a, and the lower electrode 12b (a second lower electrode), on which the piezoelectric film 14 and the upper electrode 16 are not formed outside the resonance region 50, are formed on the substrate 10. As illustrated in FIG. 8A, the dielectric film 18a in the resonance region 50 and the dielectric film 18b on the lower electrode 12b outside the resonance region 50 are simultaneously formed. As illustrated in FIG. 8B, the upper electrode 20b is formed on the dielectric film 18b so as to face the lower electrode 12b.

Accordingly, the dielectric film 18a in the resonance region 50 of the piezoelectric thin film resonator 62 and the dielectric film 18b in the capacitor region 60 can be formed at the same time, and the number of fabrication steps is therefore reduced. In addition, the film thickness of the piezoelectric film 14 is approximately 1000 nm, while the film thickness of the dielectric film 18b can be made to be approximately 50 nm. Aluminum nitride has a relative permittivity of approximately 8.5, and silicon oxide has a relative permittivity of approximately 3.8. Thus, the capacitor region 60 of the first embodiment has a capacitance density that is approximately 10 times greater than that of the first comparative example. Therefore, the same capacitance can be obtained with the capacitor region 60 of which the area is approximately one tenth the area of the first comparative example. As described above, the film thickness of the dielectric film 18b can be made to be less than the film thickness of the piezoelectric film 14. The film thickness of the dielectric film 18b is preferably equal to or less than one-half of, more preferably equal to or less than one-fifth of, further preferably equal to or less than one tenth of the film thickness of the piezoelectric film 14. The film thickness of the dielectric film 18b is preferably 200 nm or less, more preferably 100 nm or less. The film thickness of the dielectric film 18b is preferably 10 nm or greater, more preferably 25 nm or greater.

In the acoustic wave device fabricated in the above-described method, the piezoelectric thin film resonator 62 includes the piezoelectric film 14a located on the substrate 10, the lower electrode 12a and the upper electrode 16a sandwiching the piezoelectric film 14a, and the dielectric film 18 located in the resonance region 50 as illustrated in FIG. 4. The capacitor 64 includes the dielectric film 18b that is located on the substrate 10, is made of the same material as the dielectric film 18a, and has approximately the same film thickness as the dielectric film 18a, and the lower electrode 12b and the upper electrode 20b that do not sandwich the piezoelectric film 14 and sandwich the dielectric film 18b.

When the dielectric film 18a is used as a frequency adjusting film, it is sufficient if the dielectric film 18a is formed within the resonance region 50. For example, it is sufficient if the dielectric film 18a is formed under the lower electrode 12a, in the lower electrode 12a, between the lower electrode 12a and the piezoelectric film 14a, in the piezoelectric film 14a, between the piezoelectric film 14a and the upper electrode 16a, and in the upper electrode 16a. The dielectric film 18a can be used as a protective film by forming the dielectric film 18a on the upper electrode 16a within the resonance region 50 as illustrated in FIG. 8A.

Furthermore, as illustrated in FIG. 7A, the lower electrodes 12a and 12b are preferably formed at the same time. This configuration reduces the number of fabrication steps. In this case, the lower electrodes 12a and 12b are made of the same material, and the lower electrodes 12a and 12b have approximately the same film thickness.

Furthermore, as illustrated in FIG. 8B, the upper electrode 20b is preferably formed at the same time as the wiring line 20a to be coupled to the upper electrode 16a. In this case, the wiring line 20a and the upper electrode 20b are made of the same material, and the wiring line 20a and the upper electrode 20b have approximately the same film thickness.

Figure 6C:
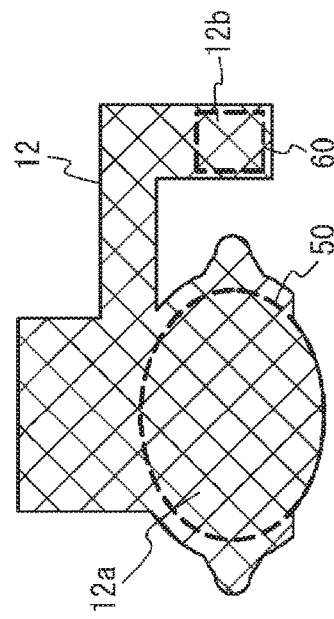
Figure 6D:
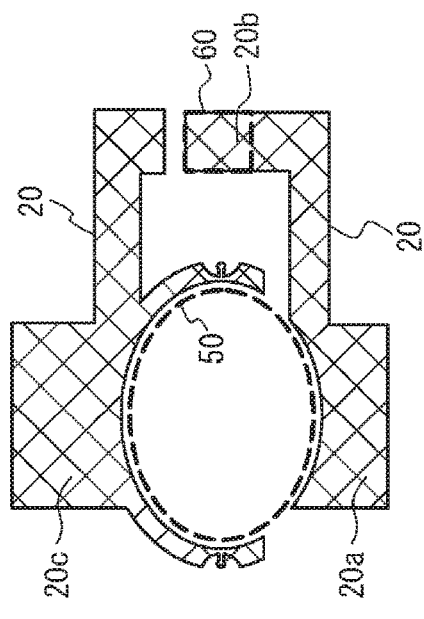

As illustrated in FIG. 5 and FIG. 6C, the wiring line 20a and the upper electrode 20b are continuously located. As illustrated in FIG. 5 and FIG. 6A, the lower electrode 12a and the lower electrode 12b are continuously located. This structure allows the capacitor 64 to be connected in parallel to the piezoelectric thin film resonator 62.

Second Embodiment

Figure 10:
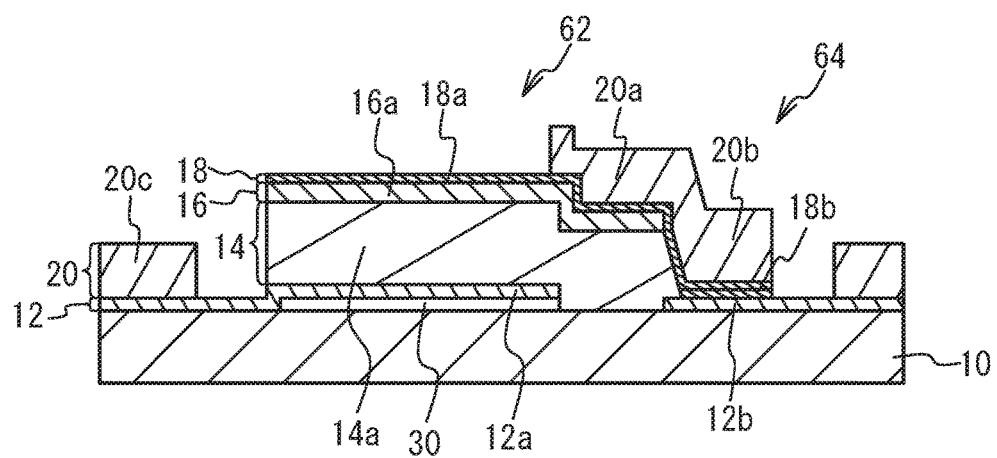
FIG. 10 is a cross-sectional view of an acoustic wave device in accordance with a second embodiment.
Figure 11:
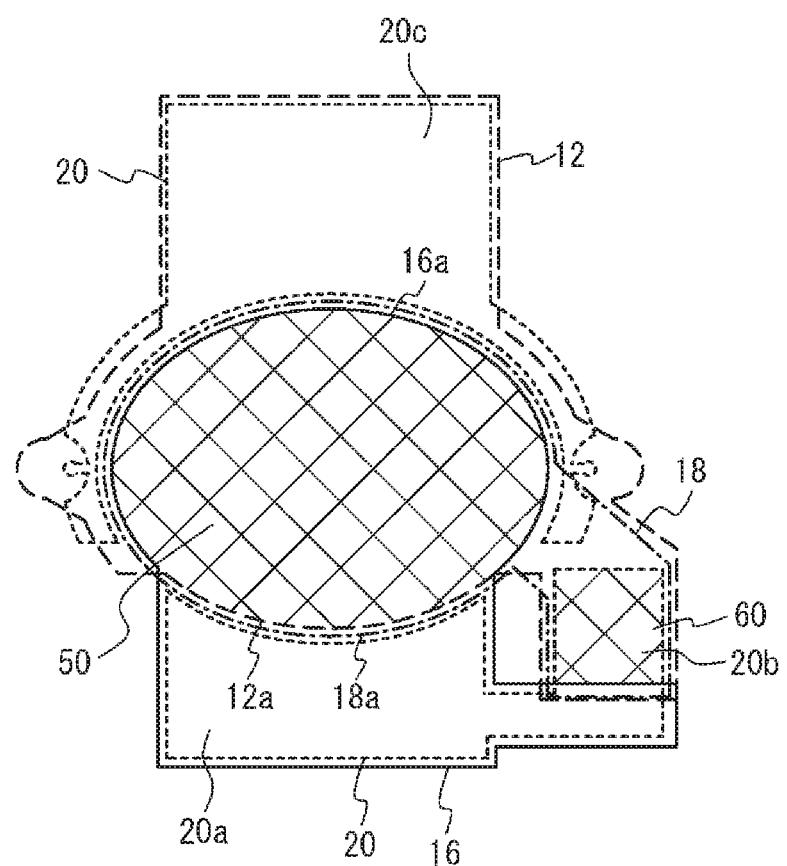
FIG. 11 is a plan view of the acoustic wave device in accordance with the second embodiment.
Figure 12A:
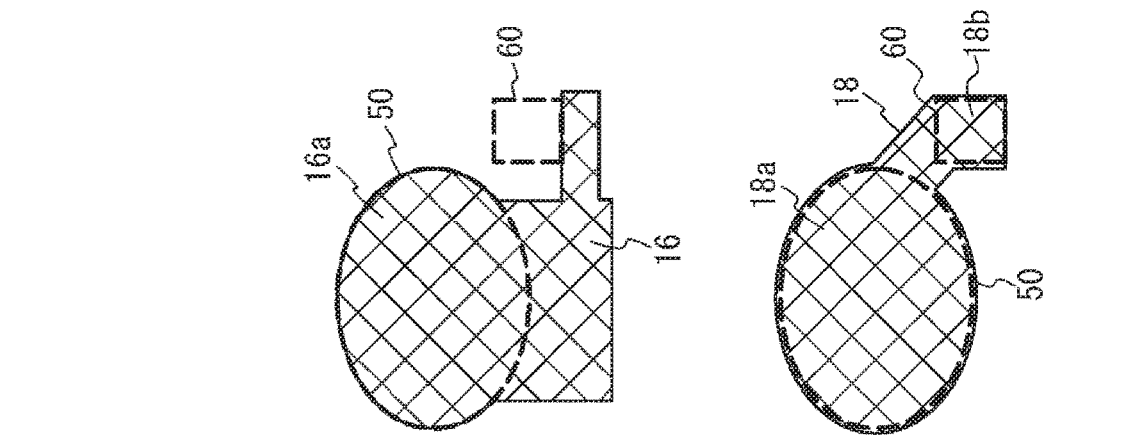
FIG. 12A through FIG. 12D are plan views of the lower electrode 12, the upper electrode 16, the wiring line 20, and the dielectric film 18, respectively.
Figure 12B:
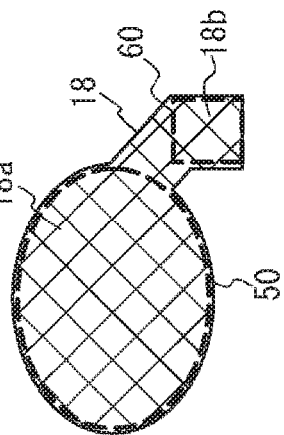
Figure 12C:
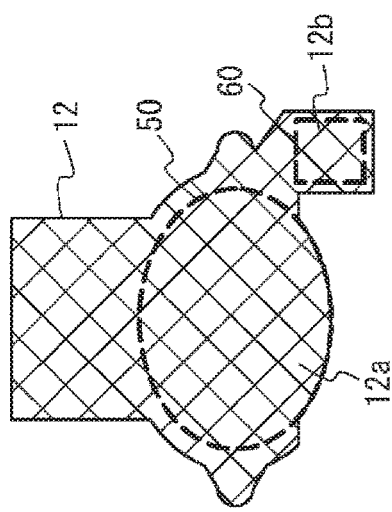
Figure 12D:
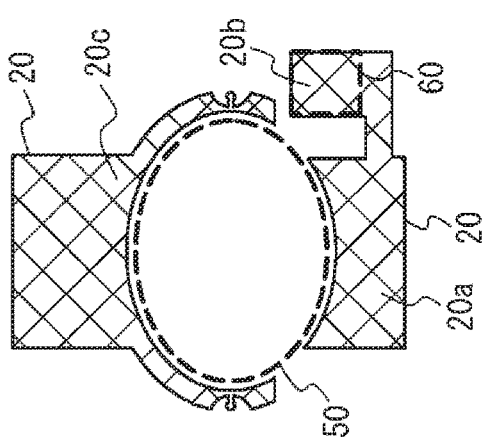

FIG. 10 is a cross-sectional view of an acoustic wave device in accordance with a second embodiment. As illustrated in FIG. 10, the dielectric films 18a and 18b are continuously formed. FIG. 11 is a plan view of the acoustic wave device in accordance with the second embodiment. FIG. 12A through FIG. 12D are plan views of the lower electrode 12, the upper electrode 16, the wiring line 20, and the dielectric film 18, respectively.

As illustrated in FIG. 10 through FIG. 12D, the dielectric films 18a and 18b are continuously formed. This structure reduces the size of the acoustic wave device. Other structures are the same as those of the first embodiment, and the description thereof is thus omitted.

Third Embodiment

Figure 13A:
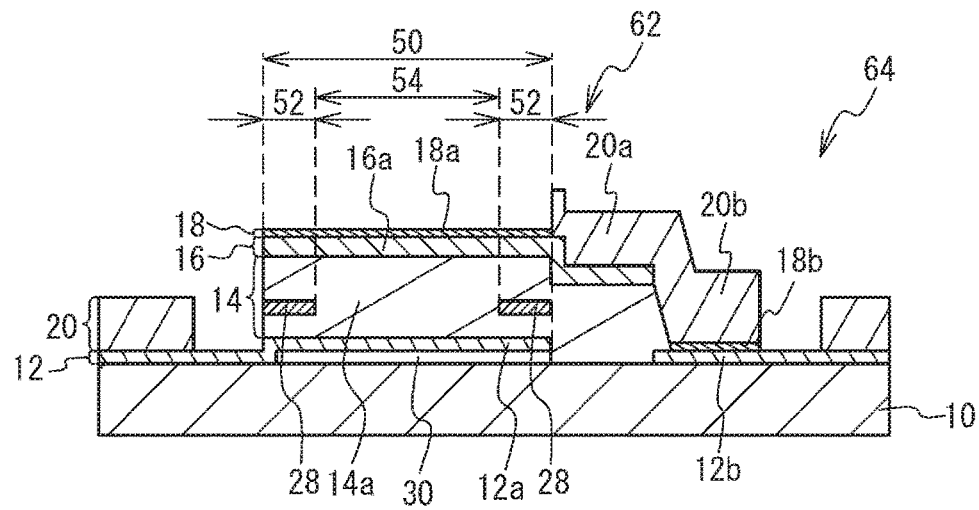
FIG. 13A through FIG. 13C are cross-sectional views (No. 1) of an acoustic wave device in accordance with a third embodiment.
Figure 13B:
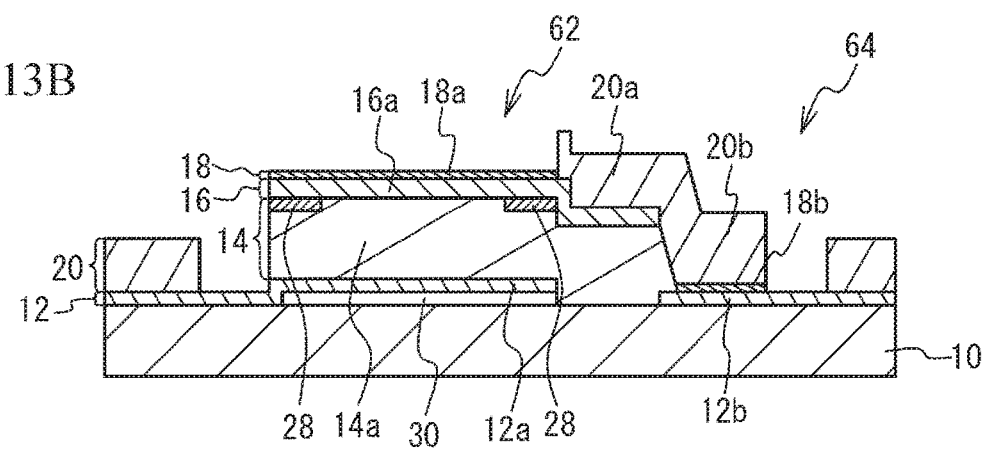
Figure 13C:
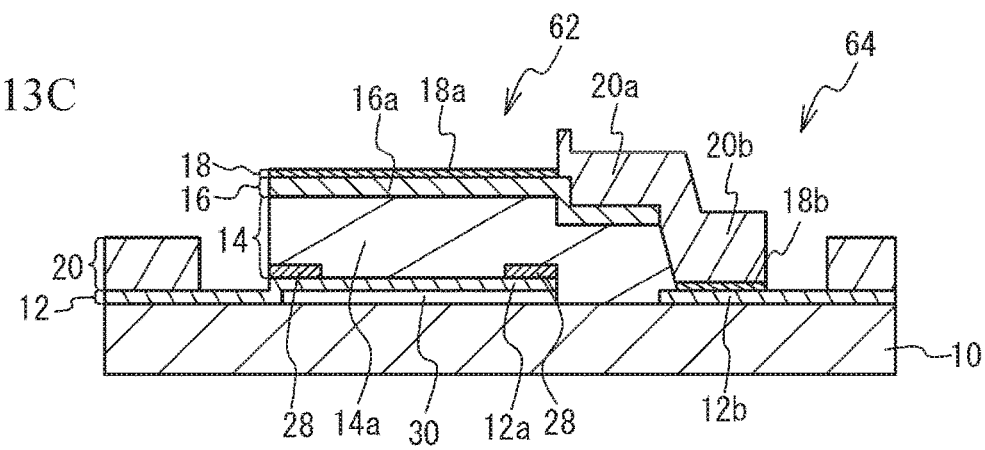

A third embodiment describes an example in which the piezoelectric film 14a includes an insertion film 28 or a temperature compensation film. FIG. 13A through FIG. 14C are cross-sectional views of an acoustic wave device in accordance with the third embodiment. As illustrated in FIG. 13A, the insertion film 28 is inserted in the piezoelectric film 14a. As illustrated in FIG. 13B, the insertion film 28 is interposed between the piezoelectric film 14a and the upper electrode 16a. As illustrated in FIG. 13C, the insertion film 28 is interposed between the lower electrode 12a and the piezoelectric film 14a. Other structures are the same as those of the first embodiment, and the description thereof is thus omitted.

The insertion film 28 is located in an outer peripheral region 52 within the resonance region 50, and is not located in a center region 54. The outer peripheral region 52 is located within the resonance region 50, includes the outer periphery of the resonance region 50, and is located along the outer periphery. The center region 54 is located within the resonance region 50, and includes the center of the resonance region 50. The center may not necessarily be a geometric center.

A material having a Young's modulus less than that of the piezoelectric film 14a or acoustic impedance less than that of the piezoelectric film 14a is used for the insertion film 28. This configuration reduces the acoustic wave leaking from the resonance region 50 in the lateral direction. Thus, the Q-value of the piezoelectric thin film resonator 62 is improved. The insertion film 28 is, for example, a silicon oxide film or an aluminum film.

Figure 14A:
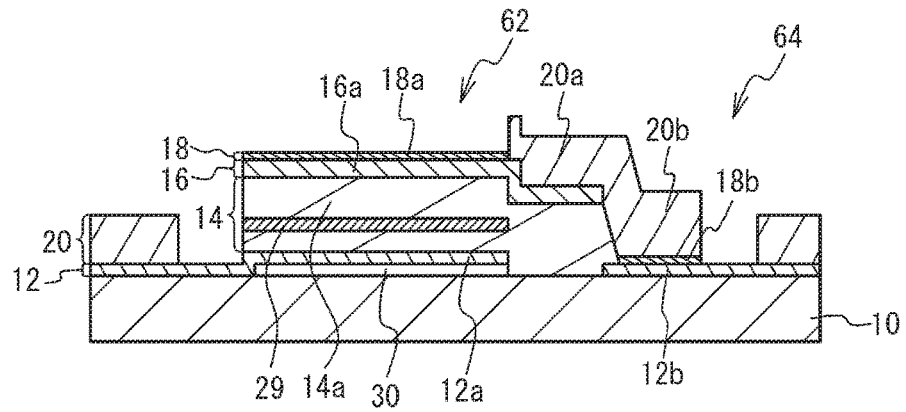
FIG. 14A through FIG. 14C are cross-sectional views (No. 2) of the acoustic wave device in accordance with the third embodiment.
Figure 14B:
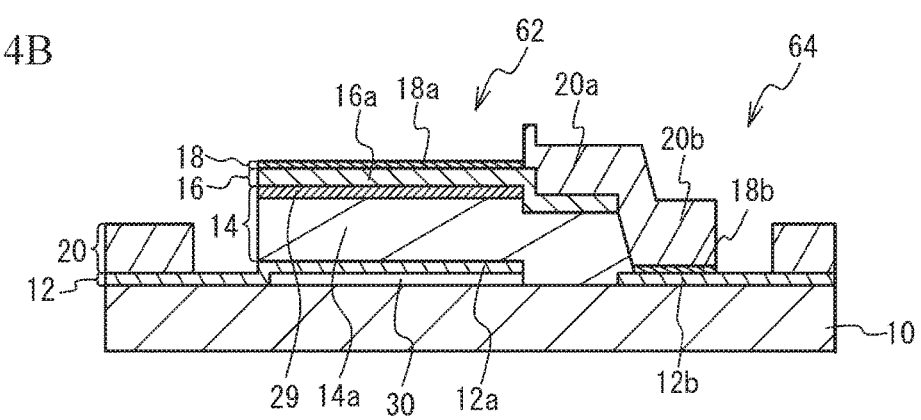
Figure 14C:
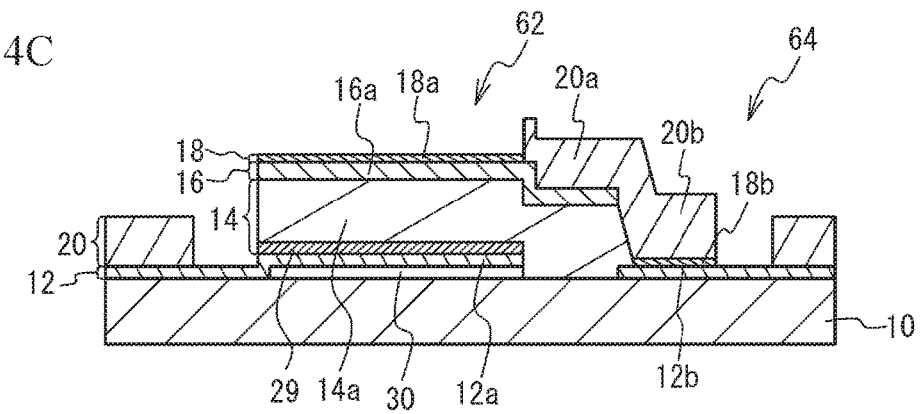

As illustrated in FIG. 14A, a temperature compensation film 29 is inserted in the piezoelectric film 14a. As illustrated in FIG. 14B, the temperature compensation film 29 is interposed between the piezoelectric film 14a and the upper electrode 16a. As illustrated in FIG. 14C, the temperature compensation film 29 is interposed between the lower electrode 12a and the piezoelectric film 14a. Other structures are the same as those of the first embodiment, and the description thereof is thus omitted.

The temperature compensation film 29 is located in at least a part of the resonance region 50, and is preferably located across the entire of the resonance region 50. The temperature compensation film 29 has a temperature coefficient of an elastic constant opposite in sign to the temperature coefficient of the elastic constant of the piezoelectric film 14a. This configuration reduces the frequency temperature dependence of the piezoelectric thin film resonator 62. The temperature compensation film 29 is, for example, a silicon oxide film.

As described in the third embodiment, the piezoelectric thin film resonator 62 may have the insertion film 28 or the temperature compensation film 29. When the insertion film 28 or the temperature compensation film 29 is a dielectric film, the dielectric film 18b may be formed at the same time as the insertion film 28 or the temperature compensation film 29. That is, the material and the film thickness of the dielectric film 18b may be substantially the same as the material and the film thickness of the insertion film 28 or the temperature compensation film 29, respectively. Alternatively, the piezoelectric thin film resonator 62 of the acoustic wave device in accordance with the second embodiment may have the insertion film 28 or the temperature compensation film 29.

Fourth Embodiment

Figure 15A:
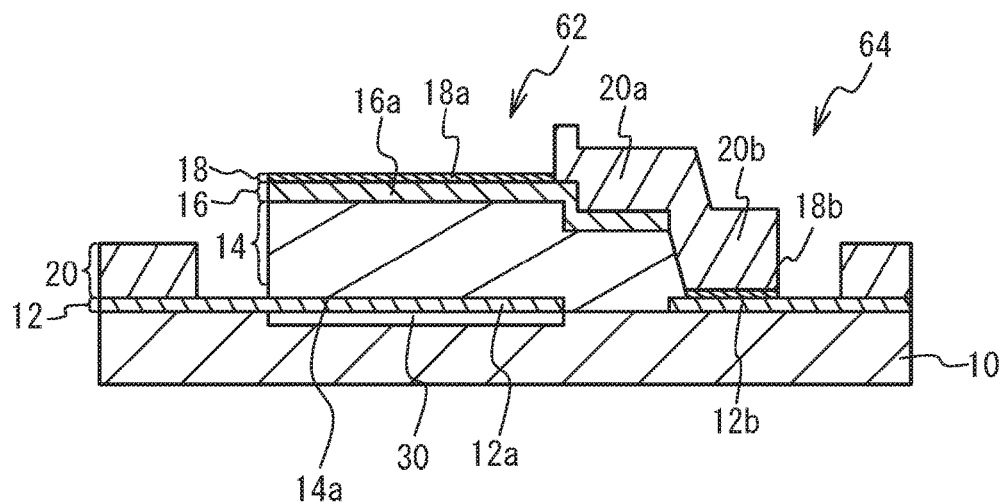
FIG. 15A and FIG. 15B are cross-sectional views of acoustic wave devices in accordance with a fourth embodiment and a first variation thereof, respectively.
Figure 15B:
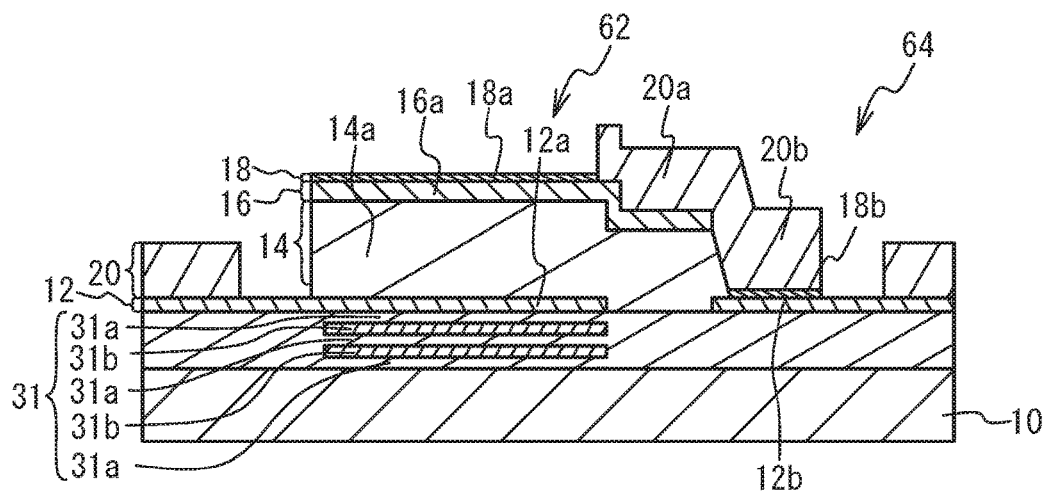

A fourth embodiment changes the structure of the air gap. FIG. 15A and FIG. 15B are cross-sectional views of acoustic wave devices in accordance with the fourth embodiment and a first variation thereof, respectively. As illustrated in FIG. 15A, a recess is formed on the upper surface of the substrate 10. The lower electrode 12 is flatly formed on the substrate 10. This structure forms the air gap 30 in the recess of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film may be formed so as to be in contact with the lower surface of the lower electrode 12. That is, the air gap 30 may be formed between the substrate 10 and an insulating film being in contact with the lower electrode 12. The insulating film is, for example, an aluminum nitride film.

As illustrated in FIG. 15B, an acoustic mirror 31 is formed under the lower electrode 12 in the resonance region 50. The acoustic mirror 31 includes a film 31a with low acoustic impedance and a film 31b with high acoustic impedance that are alternately stacked. Each of the films 31a and 31b has a film thickness of, for example, approximately $\lambda/4$ ($\lambda$ is the wavelength of the acoustic wave). The number of layers made of the films 31a and the film 31b can be freely selected. For example, the acoustic mirror 31 may have a structure in which a single film with acoustic impedance different from the acoustic impedance of the substrate 10 is located in the substrate 10. Other structures are the same as those of the first embodiment, and the description thereof is thus omitted.

In the first through third embodiments, the air gap 30 may be formed as in the fourth embodiment, or the acoustic mirror 31 may be formed instead of the air gap 30 as in the first variation of the fourth embodiment.

As described in the first through fourth embodiments, the piezoelectric thin film resonator may be a Film Bulk Acoustic Resonator (FBAR) in which the air gap 30 is formed between the substrate 10 and the lower electrode 12 in the resonance region 50. Alternatively, as described in the first variation of the fourth embodiment, the piezoelectric thin film resonator may be a Solidly Mounted Resonator (SMR) in which the acoustic mirror 31 reflecting the acoustic wave propagating through the piezoelectric film 14 is located under the lower electrode 12 in the resonance region 50. As described above, it is sufficient if the acoustic reflection layer located in or on the substrate 10 includes the air gap 30 or the acoustic mirror 31 formed by stacking at least two layers having different acoustic characteristics.

The first through fourth embodiments describe an exemplary case where the resonance region 50 has an elliptical shape, but the resonance region 50 may have a polygonal shape such as a quadrangle shape or a pentagonal shape.

Fifth Embodiment

Figure 16:
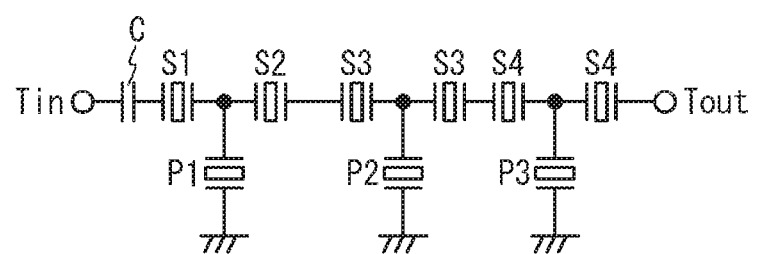
FIG. 16 is a circuit diagram of a filter in accordance with a fifth embodiment.

FIG. 16 is a circuit diagram of a filter in accordance with a fifth embodiment. As illustrated in FIG. 16, the capacitor C is not connected in parallel to the series resonator S2, and the capacitor C is connected in series between the input terminal Tin and the series resonator S1. The capacitor C is the capacitor 64 of the first through fourth embodiments. As described above, it is sufficient if the capacitor C is formed on the single substrate 10 on which the piezoelectric thin film resonator 62 is also formed. The number of series resonators and the number of parallel resonators in the ladder-type filter can be freely selected. The piezoelectric thin film resonator to which the capacitor C is electrically connected can be freely selected. The capacitor C may not be necessarily electrically coupled to any one of the piezoelectric thin film resonators on the substrate 10. The filter may be a filter such as a multimode type filter other than the ladder-type filter.

Sixth Embodiment

Figure 17:
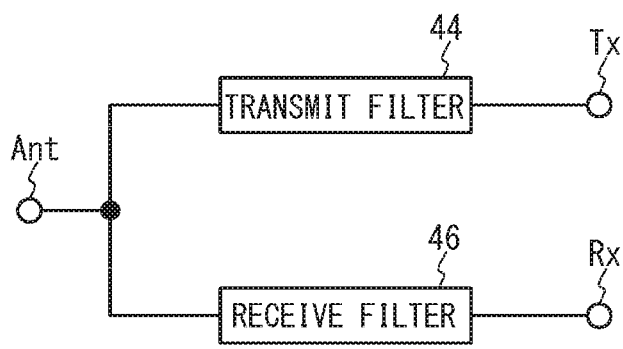
FIG. 17 is a circuit diagram of a duplexer in accordance with a sixth embodiment.

FIG. 17 is a circuit diagram of a duplexer in accordance with a sixth embodiment. As illustrated in FIG. 17, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 and the receive filter 46 may be the filter according to any one of the first through fifth embodiments.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
   a piezoelectric thin film resonator including:
      a piezoelectric film located on a substrate;
      a first lower electrode and a first upper electrode sandwiching the piezoelectric film; and
      a first dielectric film located in a resonance region in which the first lower electrode and the first upper electrode face each other across the piezoelectric film; and
   a capacitor including:
      a second dielectric film that is located on the substrate, is made of a same material as the first dielectric film, and has a film thickness approximately equal to a film thickness of the first dielectric film; and
      a second lower electrode and a second upper electrode that does not sandwich the piezoelectric film and sandwich the second dielectric film.

2. The acoustic wave device according to claim 1, wherein the first dielectric film is located on the first upper electrode in the resonance region.

3. The acoustic wave device according to claim 1, wherein
   a wiring line electrically coupled to the first upper electrode is located on the first upper electrode outside the resonance region, and
   the second upper electrode is made of a same material as the wiring line and has a film thickness approximately equal to a film thickness of the wiring line.

4. The acoustic wave device according to claim 1, wherein
   a wiring line electrically coupled to the first upper electrode is located on the first upper electrode outside the resonance region,
   the wiring line and the second upper electrode are continuously located, and
   the first lower electrode and the second lower electrode are continuously located.

5. The acoustic wave device according to claim 1, wherein
   a wiring line electrically coupled to the first upper electrode is located on the first upper electrode outside the resonance region,
   the wiring line and the second upper electrode are continuously located, and
   the first dielectric film and the second dielectric film are continuously located.

6. The acoustic wave device according to claim 1, wherein a film thickness of the second dielectric film is less than a film thickness of the piezoelectric film.

7. The acoustic wave device according to claim 1, further comprising a filter including the piezoelectric thin film resonator and the capacitor.

8. The acoustic wave device according to claim 7, further comprising a multiplexer including the filter.

* * * * *